(12) United States Patent
Lecesse (10) Patent No.: US 9,526,184 B2
(45) Date of Patent: Dec. 20, 2016

(54) CIRCUIT BOARD MULTI-FUNCTIONAL HOLE SYSTEM AND METHOD

(75) Inventor: Roy J. Lecesse, St. Louis, MO (US)

(73) Assignee: Viasystems, Inc., St. Louis, MO (US)

( * ) Notice: Subject to any disclaimer, the term of this patent is extended or adjusted under 35 U.S.C. 154(b) by 480 days.

(21) Appl. No.: 13/537,361

(22) Filed: Jun. 29, 2012

(65) Prior Publication Data
US 2014/0001150 A1    Jan. 2, 2014

(51) Int. Cl.
*H05K 3/42* (2006.01)
*C23C 18/38* (2006.01)
*C23C 18/16* (2006.01)

(52) U.S. Cl.
CPC .............. *H05K 3/429* (2013.01); *C23C 18/165* (2013.01); *C23C 18/1653* (2013.01); *C23C 18/38* (2013.01); *H05K 3/42* (2013.01); *H05K 3/422* (2013.01); *H05K 3/423* (2013.01); *H05K 2201/09645* (2013.01); *H05K 2203/0207* (2013.01); *H05K 2203/1476* (2013.01)

(58) Field of Classification Search
CPC ...................................... H05K 3/422
USPC ....................................... 427/97.2
See application file for complete search history.

(56) References Cited

U.S. PATENT DOCUMENTS

| 4,684,560 | A | 8/1987 | Minten et al. |
| 5,699,613 | A | 12/1997 | Chong et al. |
| 5,891,528 | A | 4/1999 | Turek et al. |
| 6,541,712 | B1 * | 4/2003 | Gately et al. ................. 174/266 |
| 6,710,259 | B2 * | 3/2004 | Thorn et al. .................. 174/257 |
| 6,727,174 | B1 | 4/2004 | Kotecki et al. |
| 7,427,562 | B2 | 9/2008 | Magera et al. |
| 2003/0121699 | A1 | 7/2003 | Happoya |
| 2004/0118605 | A1 | 6/2004 | Van Der Laan |
| 2006/0072298 | A1 * | 4/2006 | Ng et al. ....................... 361/818 |
| 2008/0286538 | A1 * | 11/2008 | Yokozawa et al. ........... 428/209 |
| 2010/0147575 | A1 | 6/2010 | Lee et al. |

OTHER PUBLICATIONS

International Search Report and Written Opinion regarding PCT/US2012/045263 issued Sep. 11, 2012, 10 pages.

* cited by examiner

*Primary Examiner* — Katherine A Bareford
(74) *Attorney, Agent, or Firm* — Polsinelli PC (57) ABSTRACT

A method and system for constructing a printed circuit board with multifunctional holes. A first conductive material is deposited into a hole in a substrate to form a first plating on an inner surface of the hole. At least one outer portion of the hole is modified to have a larger diameter than the original hole and to remove the first conductive material from that outer portion. A seed material is deposited into the modified hole. An etchant is applied to the hole to non-mechanically remove the first conductive material from the unmodified portion of the hole. Another conductive material is deposited to into the modified hole that adheres to the seed material in the modified outer portion via to form a second plating at the outer portion.

10 Claims, 7 Drawing Sheets

CIRCUIT BOARD MULTI-FUNCTIONAL HOLE SYSTEM AND METHOD

RELATED APPLICATIONS

Not Applicable.

FEDERALLY SPONSORED RESEARCH OR DEVELOPMENT

Not Applicable.

COMPACT DISK APPENDIX

Not Applicable.

BACKGROUND

Consumers are increasingly driving the electronic industry to design and produce smaller and faster electronic devices. Printed circuit boards (PCBs) are the structural foundation of most electronic devices. PCBs are used to mount various electronic components of an electronic device and to enable electrical interconnectivity and/or isolation between the electronic components. PCBs are frequently formed by laminating a plurality of conducting layers with one or more non-conducting layers that are interconnected by a plated via. The plated via structure or plated through hole in the PCB enables the transmission of electrical signals between the different layers. The plated holes are also used for component insertion.

As electronic devices continue to decrease in size, manufacturers of PCBs are constantly required to increase the efficiency and design complexity of the electrical interconnections of PCBs. The present invention is directed to an improved and more efficient process and system for manufacturing a PCB with multi-functional holes.

SUMMARY

According to one aspect, a method is provided for selectively plating a via of a multi-layered substrate. The method includes forming a via through a multi-layered substrate, the via having a first diameter and a first inner wall surface. The method also includes depositing a first conductive material into the via to form a first plating on the first inner wall. The method also includes modifying the via to comprise a medial portion, a first outer portion, and a second outer portion. The medial portion comprises the first diameter and the first inner surface. The first outer portion comprises a second diameter and a second inner surface. The second outer portion comprises the second diameter and a second surface, wherein the second and third diameters are larger than the first diameter. The method includes depositing a second conductive material onto at least the second inner surface and the third inner surface in the modified via. The method also includes removing the first conductive material from the medial portion by applying an etchant to the modified via. The method also includes depositing a third conductive material into the modified via to form a second plating on the second conductive material deposited on the second and third inner surfaces of the modified via.

According to another aspect, a process for selectively plating a hole of a printed circuit board is provided. The process includes forming a hole through a printed circuit board. The hole includes a first diameter and a first inner wall surface. The process includes depositing a first conductive material into the hole to form a first plating on the first inner wall. The process also includes modifying the hole to comprise a first portion and a second portion. The first portion includes the first diameter and the first inner surface and the second portion includes a second diameter and a second inner surface. The process also includes depositing a second conductive material onto the second inner surface in the modified hole. The process also includes removing the first conductive material from the first portion by applying an etchant to the modified hole. The process also includes depositing a third conductive material into the modified hole to form a second plating on the second conductive material deposited on the second surface of the modified hole.

According to another aspect, a system for selectively plating a hole of a printed circuit board is provided. The system includes a drilling system to form a hole through a printed circuit board. The hole has a first diameter and a first inner wall surface. The drilling system also modifies the hole to include at least a first portion and a second portion. The first portion includes the first diameter and the first inner surface and the second portion includes a second diameter and a second inner surface. The system also includes a deposition system to deposit a first conductive material into the hole to form a first plating on the first inner wall prior to the hole being modified. The deposition system also deposits a second conductive material onto at least the second inner surface in the modified hole. The system also includes an etchant application system to apply an etchant to the modified hole to remove the first conductive material from the first inner wall. The a deposition system is further configured to deposit a third conductive material into the modified hole to form a second plating on the second conductive material deposited on the second surface of the modified hole.

DETAILED DESCRIPTION

Figure 1A:
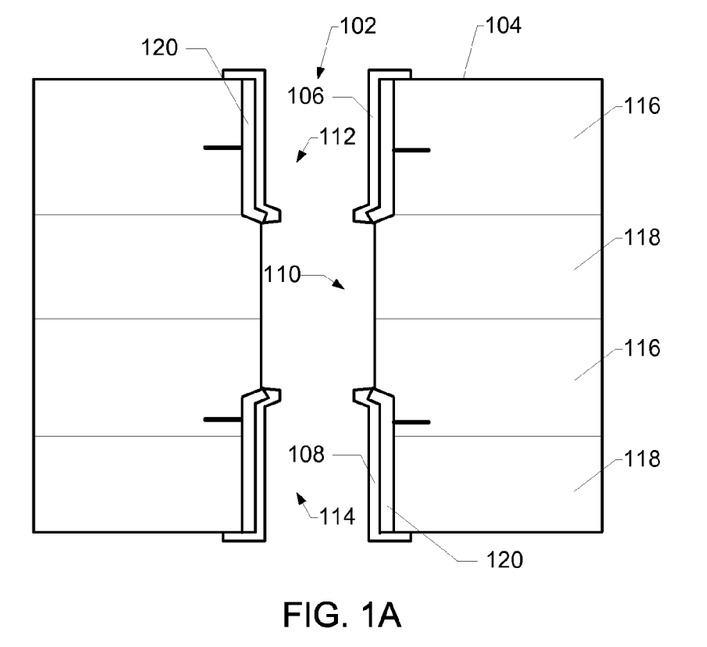
FIGS. 1A and 1B are cross sectional views of a multi-layered substrate with a multi-functioning hole constructed according to aspects of the present invention.

FIG. 1A depicts a multilayer printed circuit board (PCB) 100 with a multi-functional via or through hole ("hole") 102 constructed in accordance with an aspect of the present invention. According to one aspect, the PCB 100 includes a substrate 104 with one or more holes 102. The hole 102 is plated with a first conductor 106 and a second conductor 108.

In this example, the plated hole 102 has a medial portion 110, an upper portion 112, and a lower portion 114. The first conductor 106 is disposed within the hole 102 at the upper portion 112 and supported by the substrate 104. The second conductor 108 is disposed within the hole 102 at the lower portion 114 and supported by the substrate 104. There is no conductive material on the inner surface at medial portion 110 of the hole. As a result, the first conductor 106 in the upper portion 112 is isolated or insulated from the second conductor 108 at the lower portion 114.

The substrate 104 is, for example, any material that can be used to support electrical components, conductors, and the like. In one preferred embodiment, substrate 100 includes multiple layers of interleaved conductive paths (e.g., see 202 and 204 in FIG. 2A) and insulators. The substrate 104 may include one or more conducting layers 116 that are separated by one or more dielectric layers 118. The plated hole 102 is plated with a seed or first conductive material 120 and a further coating or second conductive material (e.g., conductors 106 or 108). As explained in more detail below, the seed or first type conductive material 120 is, for example, a carbon/graphite or conductive polymer to which the second conductive material adheres during a deposition process. The plated hole 102 is effectively partitioned into a plurality of electrically isolated portions (112 and 114) by selectively depositing plating material onto surfaces and etching plating material away from surfaces of a dual diameter hole formed in the substrate.

Figure 1B:
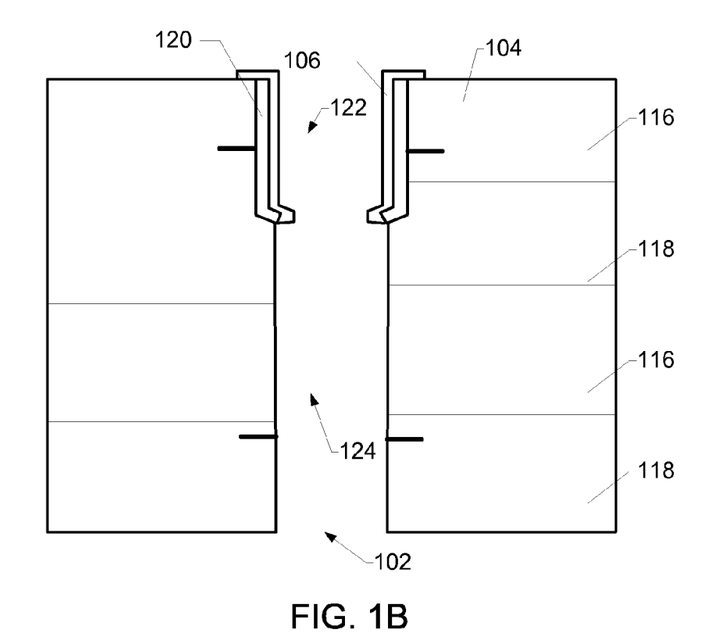

In other aspects, as depicted in FIG. 1B, it is contemplated that the PCB 100 may include one or more multifunctional holes that have a single conductor disposed within the hole 102 on one side 122 of the substrate 104. There is no conductive material on the inner surface of the remaining portion 124 of the hole 102.

A process of selectively plating via or hole, such as plated hole 102, is described herein with reference to FIGS. 2A-2H.

Figure 2A:
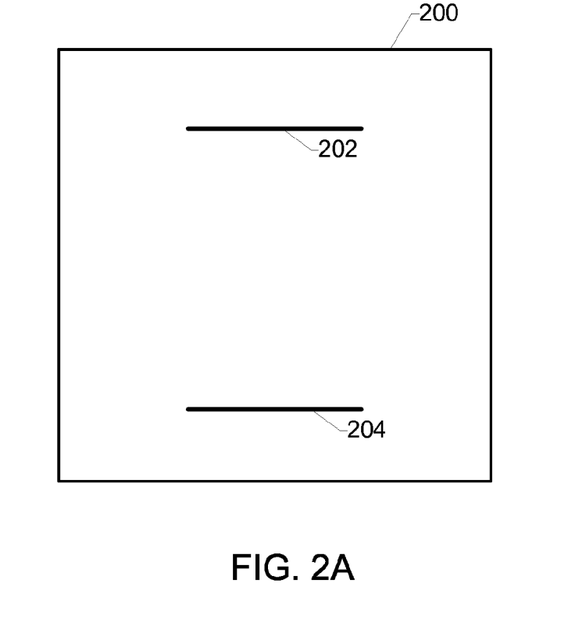
FIGS. 2A-2H are cross sectional views of a multi-layered substrate at different stages in the formation of the multi-layered substrate depicted in FIG. 1.
Figure 2B:
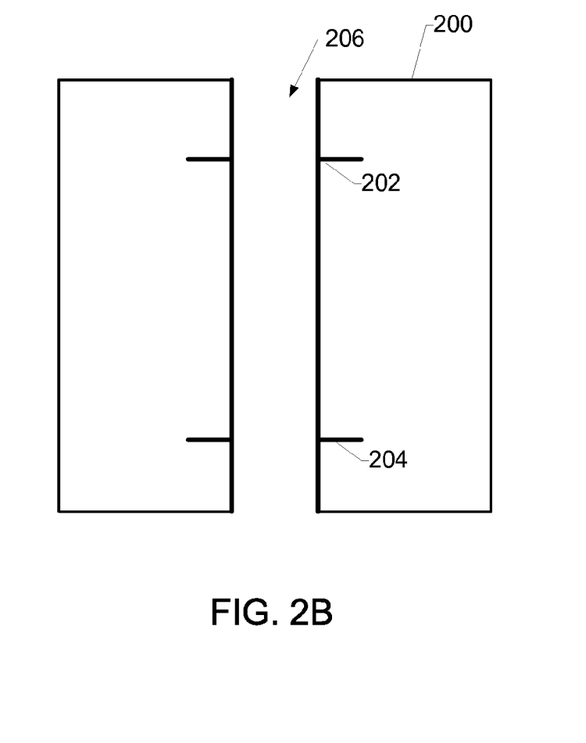

FIG. 2A depicts a cross section view of multilayered substrate 200. The multilayered substrate 200 includes conductive paths 202 and 204. FIG. 2B depicts another cross section view of the multilayered substrate 200 after a hole 206 has been formed through the substrate 200. The hole 206 is formed in the substrate 200 by, for example, a drill bit. The drill bit may be a carbide drill bit in a computer controlled drill machine. In other aspects, the hole 206 is formed in the substrate 200 by, for example, a cutting process, a laser process, or a chemical process. For purposes of illustration, FIGS. 2B-2H depict a single hole 206 in the substrate 200. However, it is contemplated that multiple holes can be drilled in the substrate 200.

Figure 2C:
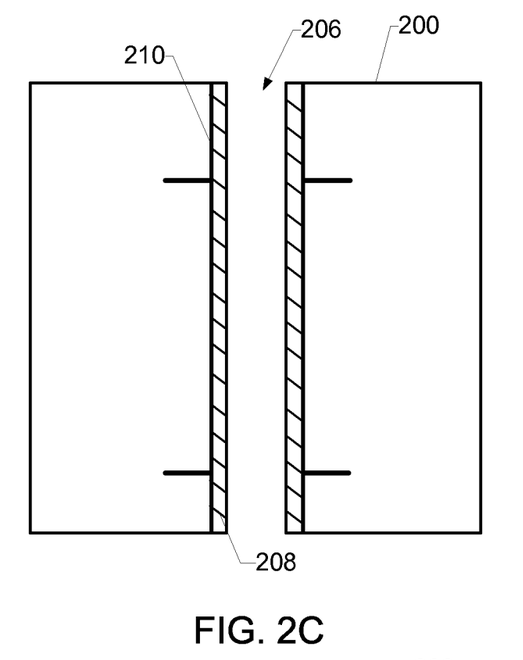

FIG. 2C depicts another cross section view of the multilayered substrate 200 after a first plating material 208 is applied to an interior surface 210 of the hole 206. It is contemplated that the thickness of the plating material 208 may vary according to intended use and/or product design. According to one aspect, the plating material 208 is applied to the interior surface of the hole by electroless metal deposition process (e.g., electroless copper deposition). As one example, a manual or programmable hoist (such as manufactured by Process Automation International Limited (PAL), located in Tai Po Industrial Estate New Territories, Hong Kong is used to facilitate the deposition process. The hoist vertically positions a rack that contains multiple baskets of PCBs, a single basket of PCBs, or a single PCBs into various chemical processes according to a pre-determined cycle to achieve the metal deposition. In another exemplary deposition process, a horizontal processing conveyor, such as manufacturer by Schmid, located in Freudenstadt, Germany is used to facilitate the deposition process. The conveyor processes the PCB's horizontally or a combination of horizontally and vertically into various chemical processes to achieve the same results of metal deposition.

Figure 2D:
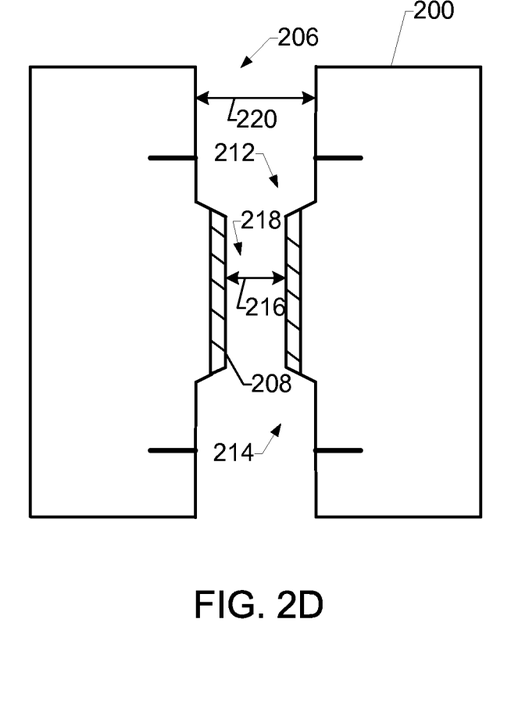

Referring now to FIG. 2D, the diameter of an upper portion 212 (e.g., upper portion 112) of the hole 206 is modified by back drilling or counter boring a predetermined distance into the substrate 200. Back drilling typically involves, for example, using a drill bit that is slightly larger in diameter than the diameter of the drill bit used to drill the original hole 206. The depth of the upper portion 212 of the hole 206 depends on the product and/or purpose for which the PCB is being designed. The diameter of the drill bit is typically sized to also remove the plating material 208 from the upper portion 212.

A lower portion 214 of the hole 206 is also modified by, for example, back drilling a specified depth into the substrate 200. In a similar manner as discussed above, backing drill removes the plating material 208 in the lower portion 214 and the depth of the modified hole 206 can be adjusted based on the product and/or purpose for which the PCB is designed.

As shown in FIG. 2D, after modification, the hole 206 has an hour glass or dumbbell shape. Stated differently, the cross-sectional dimension 216 of a medial portion 218 (e.g., portion 110) of the hole 206 is smaller than the cross-sectional dimension 220 of the upper and lower portions 212, 214 of the hole 206.

Figure 2E:
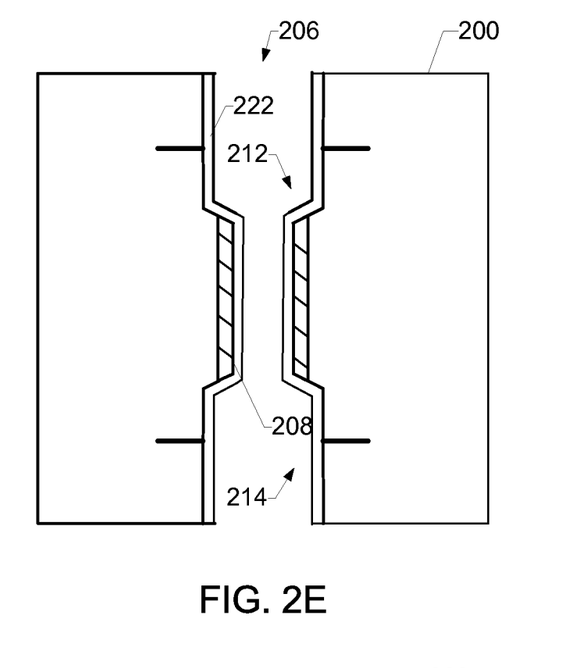

According to one aspect, as shown in FIG. 2E, after modification, a layer or plating of seeding or cladding material 222 is deposited onto on all surfaces in the hole 206. The seeding material 222 may consists of a conductive material containing a concentration of carbon and/or graphite that can be evenly deposited onto the inner surfaces of hole 206. In other aspects, the seeding material 222 is a carbon-based seeding that consists of nearly pure carbon. The seeding material 222 can be applied to the inner surfaces of the hole 206 by, for example, vapor deposition, sputtering, carbon bath, spraying, and others. Alternatively, a horizontal processing conveyor, such as manufactured by Schmid located in Freudenstadt, Germany, can be used to process the PCB through a series of chemical processes to "seed" the hole 206 for subsequent electroplating.

In one approach, a BlackHole® carbon deposition process (developed by MacDermid Corporation) is used to apply the seeding material 222. The BlackHole® process is typically used in the PCB industry to apply a carbon-based material to the inner surface of a through-hole in a circuit board to improve the adhesion of metallic plating to the inner surface of the hole when creating a plated through-hole in the board. Other deposition processes, such as Eclipse, and Shadow, may also be used to apply carbon and/or graphite onto the inner surfaces of the hole 206.

Figure 2F:
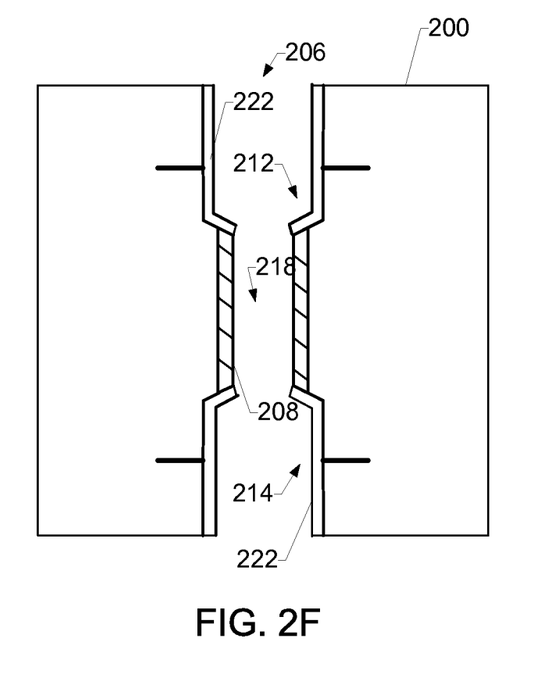

According to another aspect, as shown in FIG. 2F, the seeding material 222 is, for example, a conductive polymer. In one approach, a Soleo deposition process is used to apply the seeding material 222 onto the interior surfaces of the hole 206. Notably, the Soleo process deposits the seeding material 222 onto the surface of the hole 206 at the upper and lower portion 212, 214, but does not deposit the seeding material 222 onto the first plating material 208 (e.g., electroless copper) at the medial portion 218 of the hole 206.

Figure 2G:
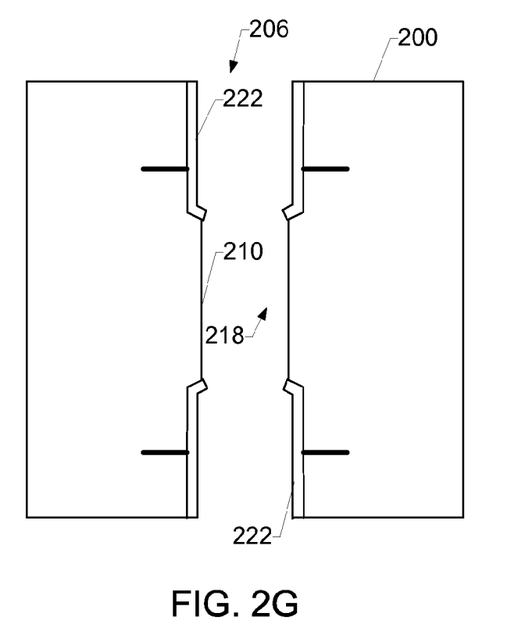

Referring now to FIG. 2G, the plating material 208 at the medial portion 218 of the hole 206 has been removed via an etching process (e.g., micro-etching). For example, if the BlackHole®, Eclipse, or Shadow process was used to apply the seeding material 222, both the seeding material 222 (carbon/graphite material) and the plating 208 (electroless copper) can be removed by micro etching. As another example, if the Soleo process was used to apply the seeding material 222, which does not adhere to the copper surfaces at the medial portion 218, the plating 208 (e.g. first conductive material 120) is removed by micro etching. Advantageously, by removing the plating 208 at the medial portion 218 by a non-mechanical means, the substrate can be processed faster and with a lower risk of damaging the hole 206 or plating within the hole.

For example, when removing electroless copper by a mechanical means, such as drilling, the drill must be accurately positioned to only remove material from the smaller medial portion 218 of the hole 206 and to avoid contact with the conductive Blackhole or Soleo coating or plating at the outer portions 212, 214 of the hole 206. If the BlackHole or Soleo conductive material is damaged during the drilling process due to improper alignment of the drill or by the extraction of the drilled electroless and resin/glass PCB material, a "void" may result in the subsequent electroplating process. Such voids can prevent proper conduction between electrical components later mounted on the PCB. To reduce the risk of such voids, conventional drilling methods use specialized tooling and optical aligning drilling machines. Typically, these machines can only produce a single-panel at a time. The optical alignment of the drill spindle to the hole to be drilled is very slow and is far less productive than the etching method. Additionally, the drilling is typically performed hole by hole. In contrast, the present method can be used to remove plating material from multiple holes at the same time. As a result, the productivity and efficiency of the etching method is exponentially higher than the drilling.

Figure 2H:
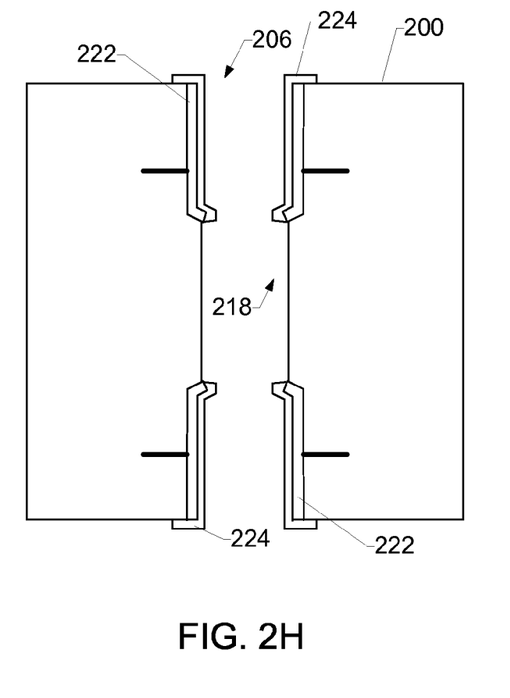

Referring now to FIG. 2H, another conductive material 224 is applied to the surface of the substrate 200 and into the hole 206 via a different deposition process, such as electrolytic copper plating. For example, the substrate 200 is placed in an electrolytic copper plating bath. Because electrolytic copper plating will only plate copper onto to seed or conductive materials (e.g., carbon/graphite 222 or conducive polymer), the medial portion 218 will not be plated with the conductive material 224 (e.g., copper). As a result, "dual diameter" dumbbell; or hour glass shaped through hole is created that has copper plating only in the upper and lower portions (i.e., larger diameter portions) of the hole 206.

Figure 3:
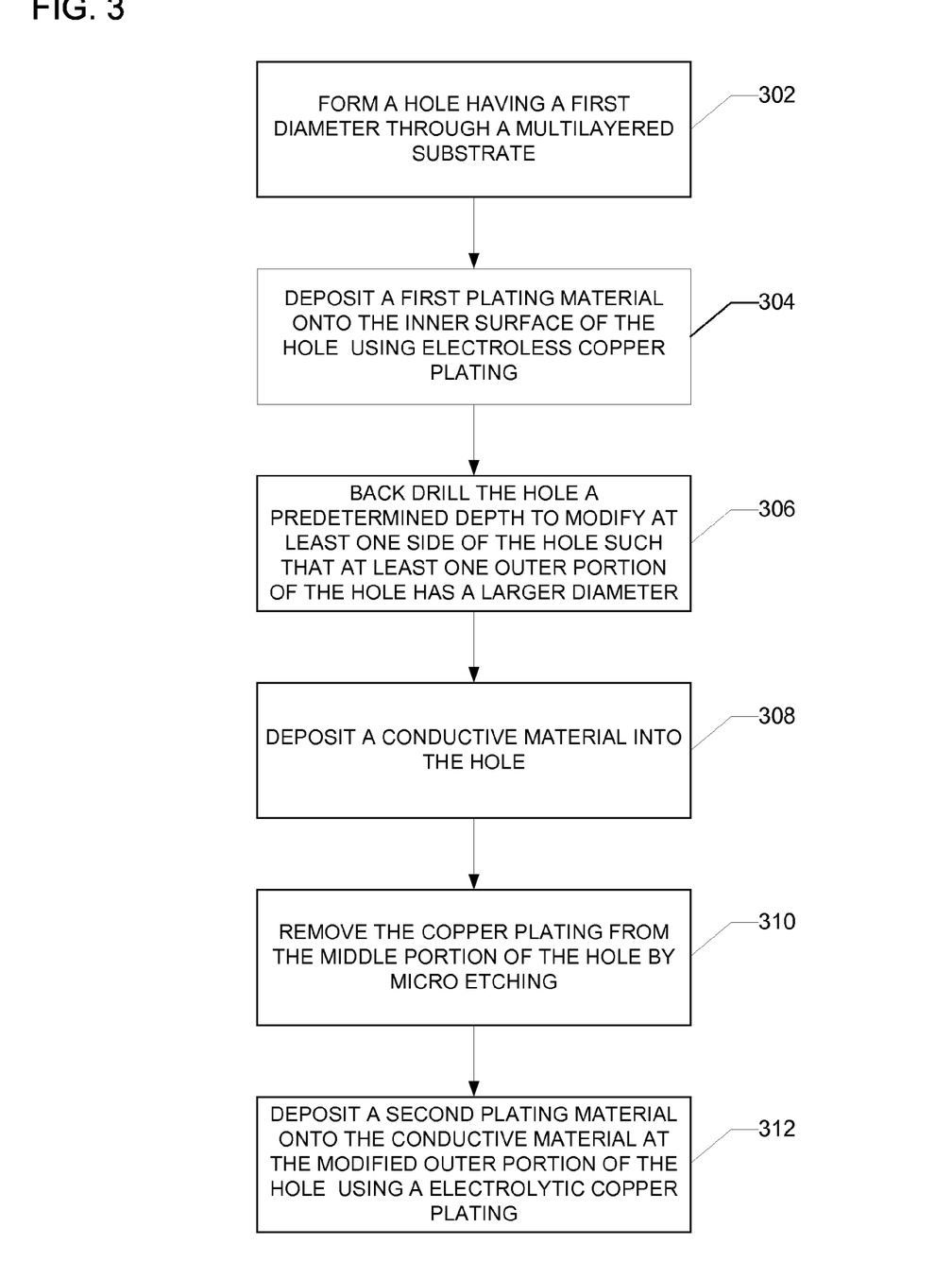
FIG. 3 illustrates a method for selectively plating a through hole of a multilayered substrate according to aspect of the invention.

FIG. 3 illustrates a method for selectively plating and constructing a through hole in a multi-layered substrate according to one aspect of the invention. A hole having a first diameter is formed in a multi-layered substrate at 302. At 304, electroless copper is deposited into the through hole to form copper plating on the inner surface of the hole. The hole is re-drilled or back drilled from opposite sides of the multi-layered substrate to modify the diameter and remove the electroless copper plating from the outer portions of the hole at the 306. At 308, a conductive material is deposited into the modified hole. Micro-etching is used to remove the remaining electroless copper plating from a medial portion of the hole at 310. At 312, another copper plating is deposited via, for example, an electrolytic copper deposition process onto the conductive material at the upper and lower portion of the hole.

Figure 4:
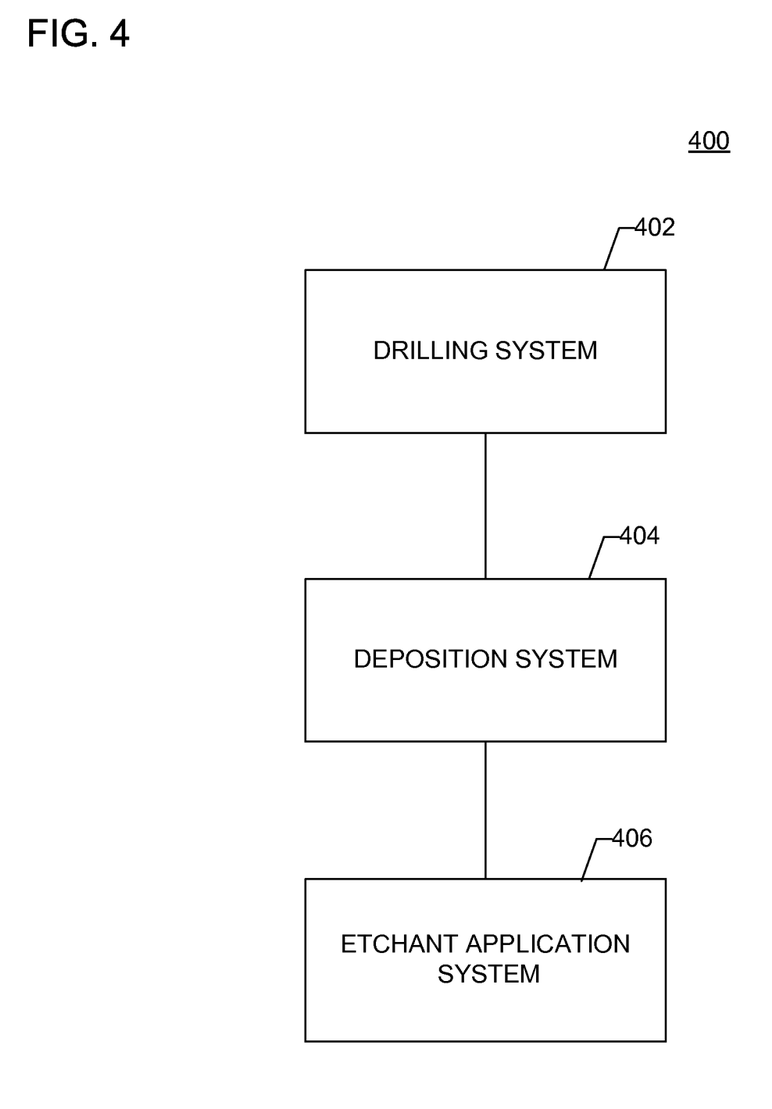
FIG. 4 is a block diagram illustrating the various components of a processing system for building the multi-layered substrate depicted in FIG. 1.

FIG. 4 is a block diagram that illustrates the various components of a processing system 400 for constructing a multilayer printed circuit board with a multi-functional hole in accordance with an aspect of the present invention. The processing system 400 includes a drilling system 402, a deposition system 404, and an etchant application system 406.

The drilling system 402 is used to form an initial through hole 206 in the substrate as shown in FIG. 2B. The drilling system 402 can also be used to modify the hole as described above in reference to FIG. 2D.

The deposition system 404 may include one or deposition machines and/or baths. The deposition system is used, for example, to perform electroless copper plating 208 within a formed hole as described above in reference to FIG. 2C. The deposition system is also used to apply the seeding material to a modified hole as described above in connection with FIGS. 2E and 2F and to apply the conductive material 224 as described above in connection with FIG. 2H.

The etchant application system 406 is used to remove seeding material 222 and/or electroless copper plating 208 as described above in connection with FIG. 2F.

Those skilled in the art will appreciate that variations from the specific embodiments disclosed above are contemplated by the invention. The invention should not be restricted to the above embodiments, but should be measured by the following claims.

The invention claimed is:

1. A method for selectively plating a via of a multi-layered substrate, the method comprising:
   forming a via through a multi-layered substrate, the via having a first diameter and a first inner surface;
   depositing a first conductive material into the via to form a plated via including a first plating on the first inner surface;
   modifying the plated via to comprise a medial portion, a first outer portion, and a second outer portion, wherein:
      the medial portion comprises the first diameter and the first inner surface, and has first conductive material remaining on the first inner surface;
      the first outer portion comprises a second diameter and a second inner surface bare of the first conductive material; and
      the second outer portion comprises a third diameter and a third inner surface bare of the first conductive material, and wherein the second and third diameters are larger than the first diameter;
   depositing a second conductive material, where the second conductive material is a conductive polymer or contains a concentration of carbon or graphite, onto at least the second inner surface and the third inner surface of the modified plated via;
   removing the remaining first conductive material from the medial portion by applying an etchant to the modified plated via; and
   depositing a third conductive material into the modified plated via to form a second plating on the second conductive material deposited on the second and third inner surfaces of the modified plated via.

2. The method of claim 1 wherein the first conductive material is deposited using electroless copper plating.

3. The method of claim 1 wherein the second conductive material is a conductive polymer that does not adhere to the first conductive material.

4. The method of claim 1 wherein the third conductive material adheres to the second conductive material on the second and third inner surfaces and does not adhere to the first inner surface.

5. The method of claim 1 wherein modifying the via comprises back drilling the via to a predetermined depth from opposite sides to form the first outer portion and the second outer portion.

6. The method of claim 1 wherein removing the first conductive material from the medial portion electrically isolates the second plating on the second surface from the second plating on the third surface.

7. The method of claim 1 wherein applying an etchant comprises microetching the first conductive material from the medial portion.

8. The method of claim 1 wherein:
depositing the second conductive material comprises depositing the second conductive material onto the second inner surface, the third inner surface, and the first conductive material at the medial portion of the modified via; and
removing the second conductive material and the first conductive material from the medial portion by applying the etchant to the modified via; and
wherein the second conductive material is a seed material that comprises graphite.

9. The method of claim 1 wherein the third conductive material is copper plating.

10. A process for selectively plating a hole of a printed circuit board, the process comprising:
forming a hole through a printed circuit board, the hole having a first diameter and a first inner surface;
depositing a first conductive material into the hole to form a plated hole comprising a first plating on the first inner surface;
modifying the plated hole to comprise a first portion and a second portion, wherein:
the first portion comprises the first diameter and the first inner surface, and has first conductive material remaining on the first inner surface; and
the second portion comprises a second diameter and a second inner surface bare of the first plating and wherein the second diameter is larger than the first diameter;
depositing a second conductive material, where the second conductive material is a conductive polymer or contains a concentration of carbon or graphite, onto the second inner surface in the modified plated hole;
removing the first conductive material from the first portion by applying an etchant to the modified plated hole; and
depositing a third conductive material into the modified hole to form a second plating on the second conductive material deposited on the second inner surface of the modified plated hole.

* * * * *